United States Patent
Pinkerton et al.

(10) Patent No.: US 7,160,651 B2
(45) Date of Patent: Jan. 9, 2007

(54) MANUFACTURABLE CHROMELESS ALTERNATING PHASE SHIFT MASK STRUCTURE WITH PHASE GRATING

(75) Inventors: Tim Pinkerton, Santa Jose, CA (US); Wen-Hao Cheng, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 106 days.

(21) Appl. No.: 10/688,851

(22) Filed: Oct. 17, 2003

(65) Prior Publication Data

US 2005/0084769 A1    Apr. 21, 2005

(51) Int. Cl.
*G03F 1/00* (2006.01)
*G03C 5/00* (2006.01)

(52) U.S. Cl. ............................ 430/5; 430/30
(58) Field of Classification Search .............. 430/5, 430/30
See application file for complete search history.

(56) References Cited

U.S. PATENT DOCUMENTS

| | | | |
|---|---|---|---|
| 6,001,512 A * | 12/1999 | Tzu et al. ................. | 430/5 |
| 2004/0101765 A1 * | 5/2004 | Sivakumar et al. ......... | 430/5 |
| 2004/0131950 A1 * | 7/2004 | Butt et al. ................. | 430/5 |

\* cited by examiner

*Primary Examiner*—S. Rosasco
(74) *Attorney, Agent, or Firm*—Fish & Richardson P.C.

(57) ABSTRACT

A chromeless APSM structure may be used to enable the pitch of features on the mask to be decreased by removing the chrome line between features, and thus remove the limit based on the size of the chrome line. The chromeless APSM may include primary features surrounded by a boundary region including sub resolution features. A relatively high precision lithography tool may be used in a first lithography step to print the features in the chromeless APSM structure. The boundary region may allow for a less precise lithography tool to be used in a second lithography step.

26 Claims, 7 Drawing Sheets

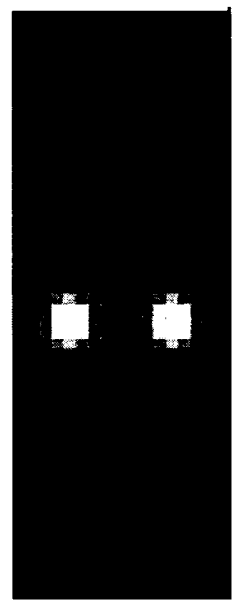
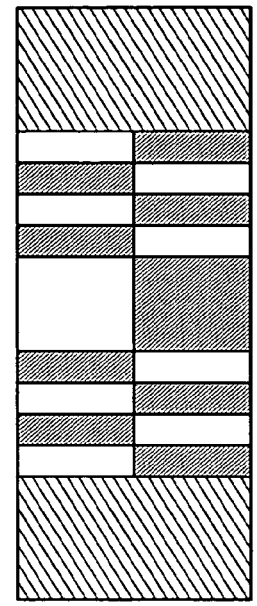
*FIG. 9A*        *FIG. 9B*
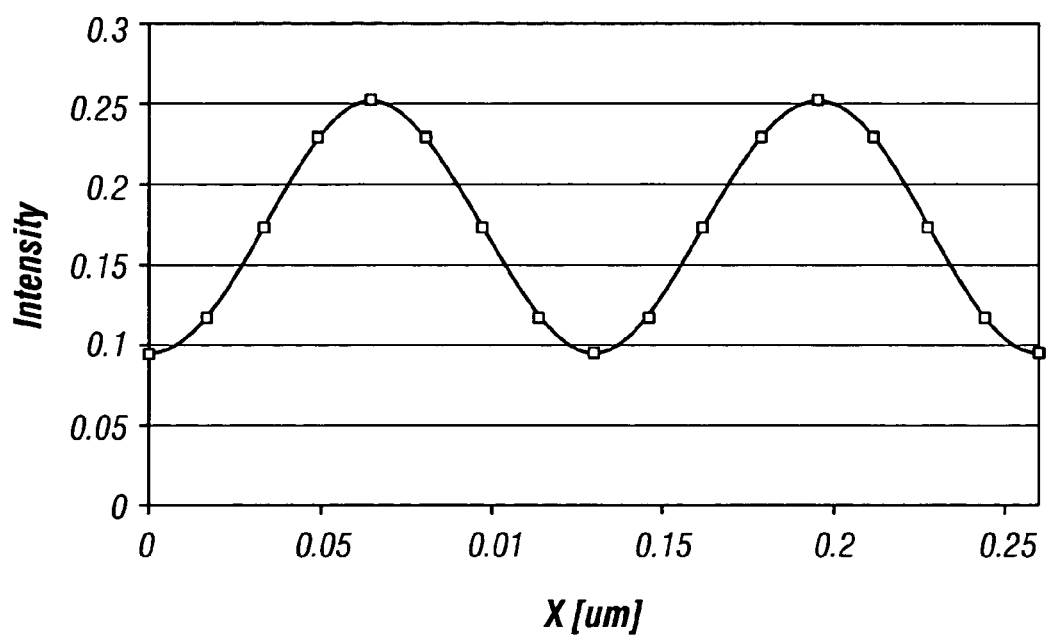
*FIG. 10*

MANUFACTURABLE CHROMELESS ALTERNATING PHASE SHIFT MASK STRUCTURE WITH PHASE GRATING

BACKGROUND

A binary photomask may include glass and chrome features which form a pattern. Light may pass through the clear glass areas and be blocked by the opaque chrome areas. Light that passes through the mask may continue through a lens, which projects an image of the mask pattern onto a wafer. The wafer is coated with a photosensitive film (photoresist), which undergoes a chemical reaction when exposed to light. After exposure, the areas on the photoresist exposed to the light may be removed in a developing process, leaving the unexposed areas as features on the wafer.

The quality of an imaged mask pattern produced with a typical binary mask may be degraded by light from clear areas on the mask diffracting into regions that ideally would be completely dark. The nominally dark region may have light diffracted into it from the adjacent nominally bright regions, thereby affecting the photoresist and quality of the printed pattern. An alternating phase shift mask (APSM) may be used to reduce such diffraction. In the APSM, alternating clear regions (which may be designated as zero (0) and pi (π) regions) may have different step heights which cause the light to be phase-shifted 180° between the two regions. As a consequence, the light diffracted into the nominally dark area from the clear zero region will interfere destructively with the light diffracted from the adjacent pi region. This may improve image contrast on the wafer.

An APSM may be fabricated by patterning all features (apertures) in the chrome layer on the quartz mask substrate in a first (binary) step. After the binary processing, the mask is recoated with resist, and the apertures that are to be quartz etched are then exposed. The open apertures are then etched to a 180° phase depth and "converted" to pi apertures. An isotropic etch step may be used to "hide" the phase edge under the chrome. The requirements for this second patterning step are relatively loose, since the chrome region between the zero and pi apertures on which the resist edges must land, which may be relatively large, e.g., about 200 nm for a 193 nm lithography system.

BRIEF DESCRIPTION OF THE DRAWINGS

FIG. 9A shows a simulated aerial view of contacts imaged with a chromeless APSM structure.

FIG. 9B shows the chromeless APSM structure used to image the contacts in FIG. 9A.

FIG. 10 shows contrast achieved on the imagery plane using an APSM structure.

DETAILED DESCRIPTION

Figure 1:
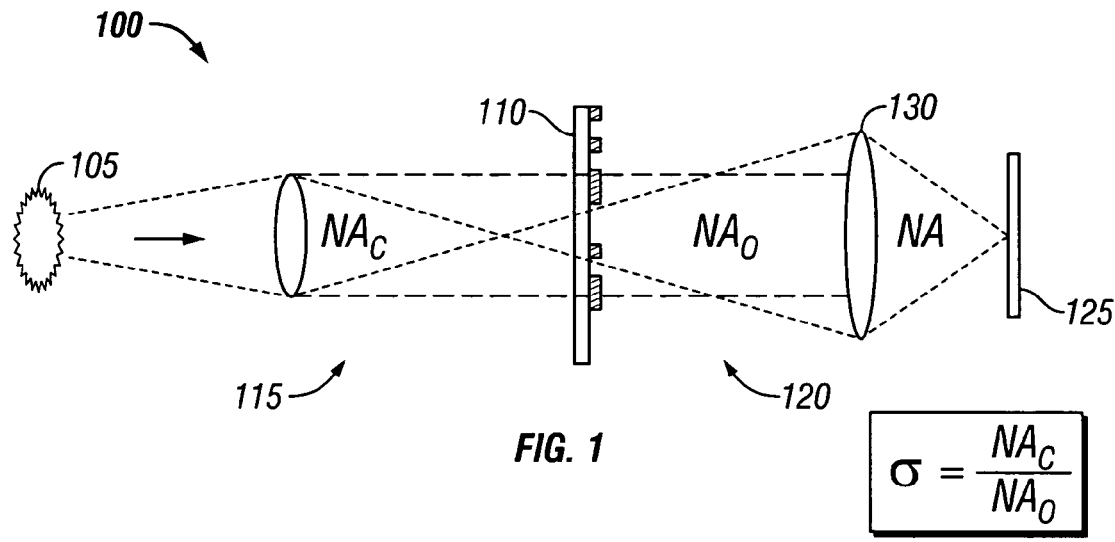
FIG. 1 shows an optical lithography system.

FIG. 1 shows an optical lithography system 100. Light from an illumination source 105 is transferred to a patterned mask (or reticle) 110 by an illumination system 115. Light passes through the mask and into the entrance pupil of an imaging system 120. The resulting pattern is imaged onto a photoresist covered wafer 125 by a lens 130 in the imaging system.

The mask 110 may be an alternating phase shift mask (APSM). The quality of an imaged pattern produced with a typical binary mask may be degraded by light from clear areas on the mask diffracting into regions that ideally would be completely dark. The nominally dark region may have light diffracted into it from the adjacent nominally bright regions. An APSM may be used to reduce such diffraction.

Figure 2:
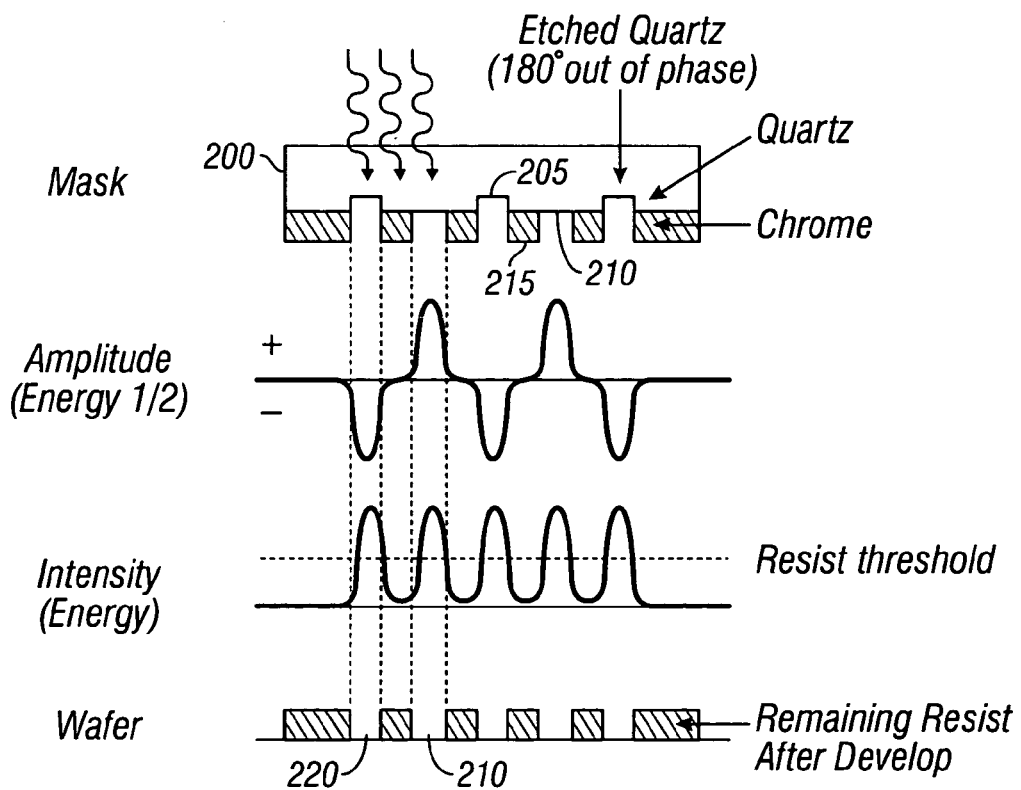
FIG. 2 is a side view of an exemplary (alternating phase shift mask) APSM in an imaging system.

FIG. 2 shows an exemplary APSM 200. In the APSM, alternating clear regions (which may be designated as zero (0) regions 210 and pi (π) regions 205) may have different step heights which cause the light to be phase-shifted 180°. As a consequence, the light diffracted into the nominally dark area 215 (covered by chrome) from the clear zero region 210 will interfere destructively with the light diffracted from the adjacent pi region 205. This may improve image contrast on the wafer.

Figure 3:
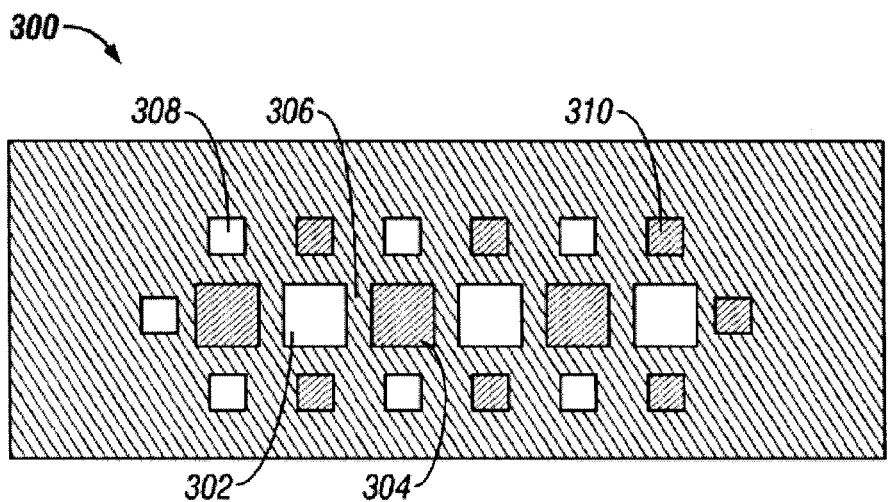
FIG. 3 is a plan view of an APSM structure including alternating phase-shifted apertures located in a chrome field.

FIG. 3 shows an APSM structure 300 including six alternating phase-shifted apertures 302, 304 located in a chrome field. The apertures may be used to print six corresponding contacts on a wafer. The structure 300 may include primary zero apertures 302 and primary pi apertures 304 separated by chrome lines 306. The primary apertures may be surrounded by a SRAF (sub-resolution assist feature) zero apertures 308 and SRAF pi apertures 310. The SRAF apertures are additional small features, typically added to the photomask by some simple width and spacing rules, which do not themselves print on the wafer, but may allow isolated or semi-isolated lines to diffract light like dense lines.

Figure 4A:
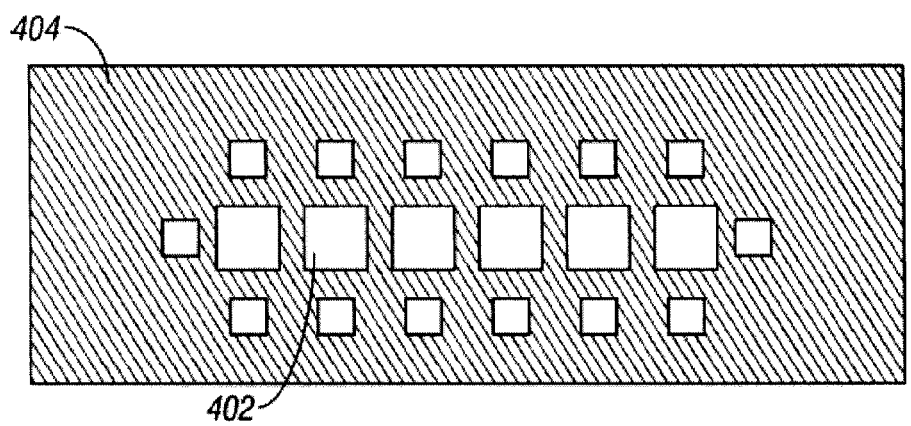
FIGS. 4A to 4C show stages in an APSM fabrication process.
Figure 4B:
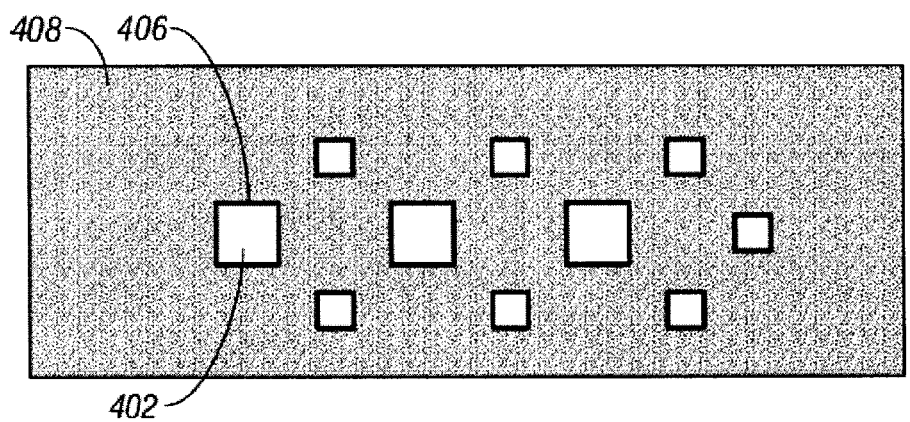
Figure 4C:
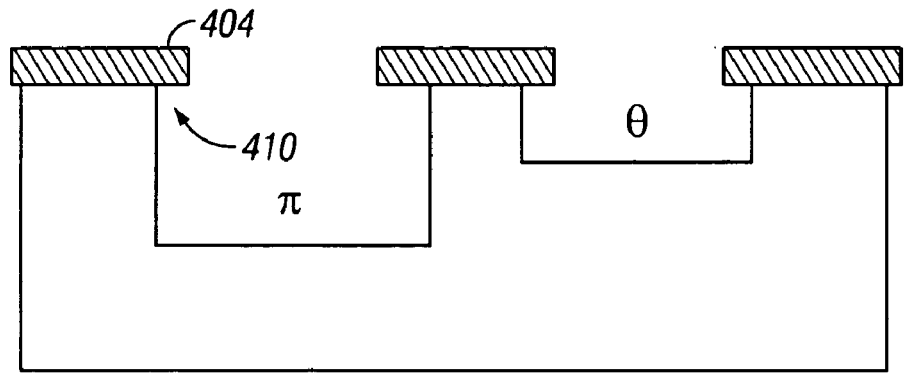

The APSM structure 300 may be fabricated by patterning all features (apertures) 402 in the chrome layer 404 on the quartz mask substrate in a first (binary) step, as shown in FIG. 4A. This first patterning step may utilize a high precision tool, such as a 50 keV electron beam lithography tool, to print the apertures on the photoresist on the chrome layer. After the binary processing, the mask is recoated with resist 406, and the apertures 408 that are to be quartz etched are then exposed in a second mask patterning step, as shown in FIG. 4B. The open apertures 408 are then etched to 180° phase depth and "converted" to pi apertures. The apertures under the resist remain zero apertures. The resist 406 may then be removed. An isotropic etch step may be used to "hide" the phase edge 410 under the chrome 404, as shown in FIG. 4C.

The requirements for the second mask patterning step (FIG. 4B) may be relatively loose, since the resist edges must land on top of the chrome 404 between the zero and pi apertures, which may be relatively large, e.g., about 200 nm for a 193 nm lithography system. Since the requirements are more relaxed for the second patterning step, a less precise, and less expensive, tool may be used, such as a laser writer.

"Pitch" refers to the center-to-center distance between features in a pattern. It may be desirable to reduce the pitch between the features on the mask to pack more features into the imaged pattern. However, the pitch may be limited by the resolution of the system (e.g., 193 nm) and the ability to decrease the size of the chrome lines between apertures, which may depend on the precision of the lithography tool used to print the apertures. For example, reducing the size of the chrome line on a mask from 200 nm (as described above) to 50 nm or less may not be feasible, even with a very precise lithography tool, such as a 50 keV electron beam lithography tool.

In an embodiment, a chromeless APSM structure may be used to enable the pitch of features on the mask to be decreased by removing the chrome line between features, and thus remove the limit based on the size of the chrome line. A chrome line may be provided in a conventional APSM to make an easy place to land resist edges between the zero and pi apertures for the second mask patterning step. However, the chrome line may not be essential for printing adjacent contacts using adjacent phase-shifted apertures in the mask structure. A line separating the adjacent contacts may be produced in the image due to destructive interference between adjacent the light diffracted from the adjacent phase-shifted apertures.

Figure 5A:
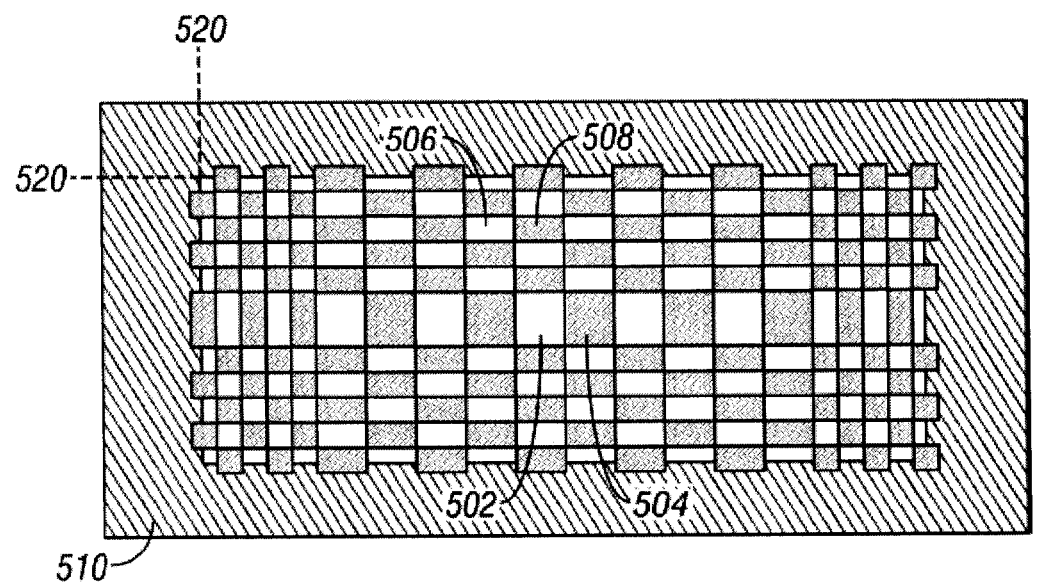
FIG. 5A is a plan view of an exemplary chromeless APSM structure.
Figure 5B:
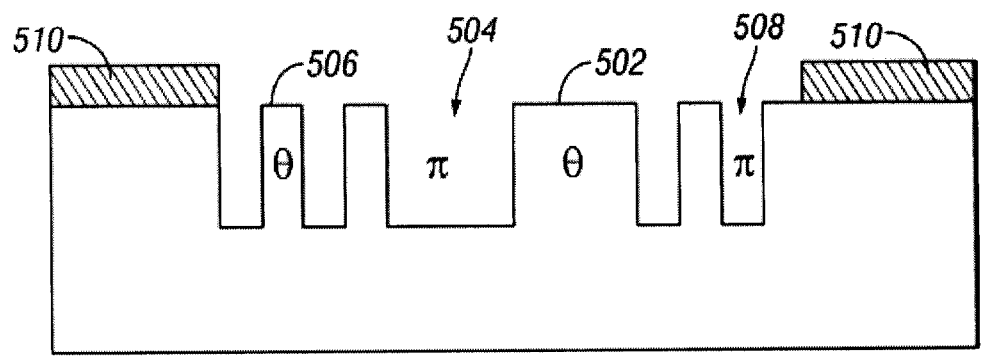
FIG. 5B is a sectional view of the exemplary chromeless APSM structure.

FIGS. 5A and 5B show a plan view and a sectional view, respectively, of an exemplary chromeless APSM structure 500. This structure may be used to print ten tightly packed contacts. Adjacent primary zero apertures 502 and primary pi apertures 504 may be used to image the contacts. The primary apertures may be surrounded by a boundary region including an alternating pattern of SRAF zero apertures 506 and SRAF pi apertures 508, which together form a phase grating. The structure may be surrounded by chrome 510. As well as providing sub-resolution assist effects, the SRAF apertures may provide a space buffer for the photoresist in the second mask patterning step in order to allow for relaxed patterning constraints.

Figure 6:
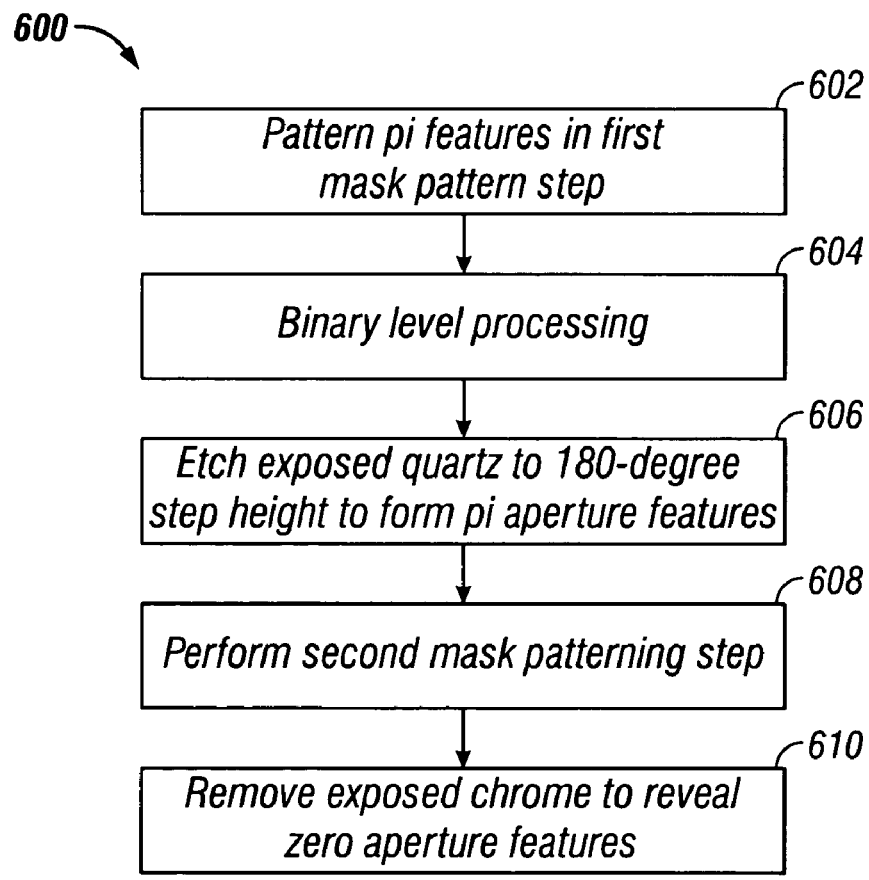
FIG. 6 is a flowchart describing a method for fabricating a chromeless APSM contact design.
Figure 7A:
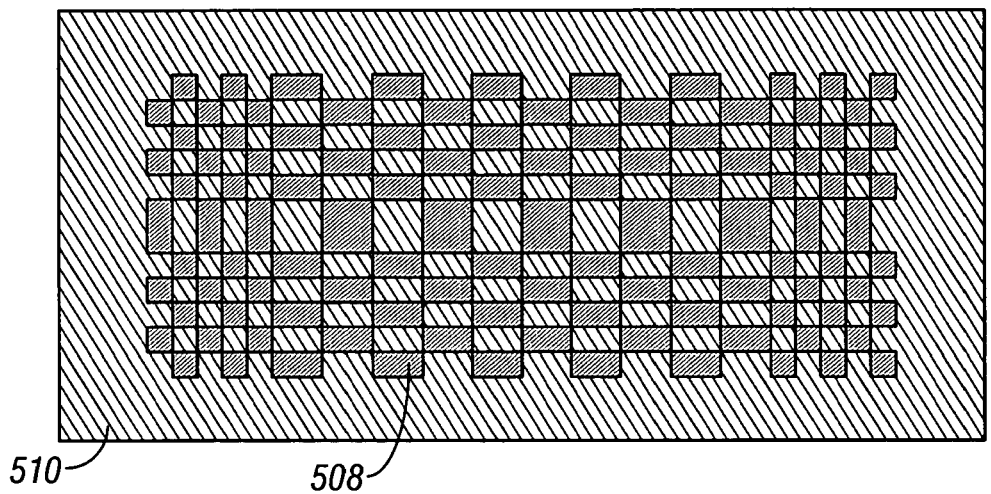
FIGS. 7A to 7B show stages in an APSM fabrication process.
Figure 7B:
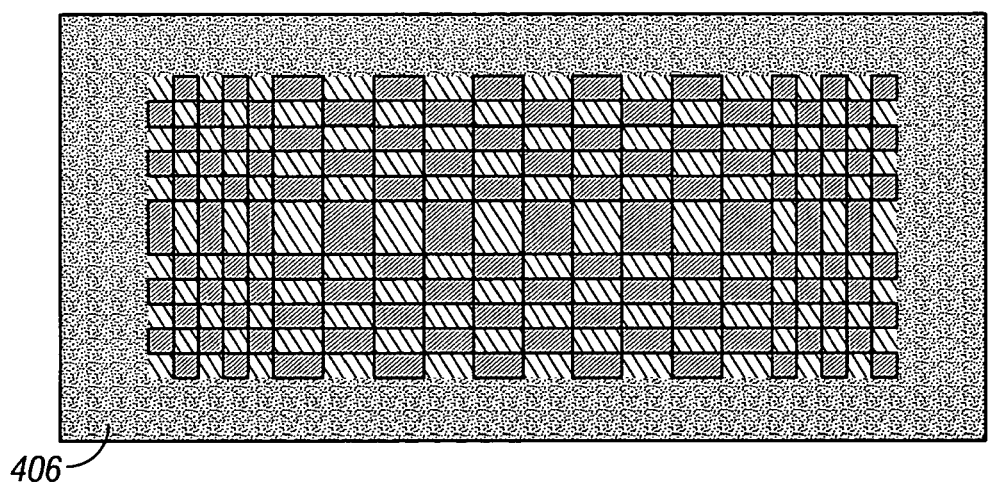

FIG. 6 is a flowchart describing a method 600 for fabricating a chromeless APSM contact design according to an embodiment. Only the pi features are patterned in the first mask patterning step (block 602), as shown in FIG. 7A. After patterning and binary level processing (block 604), the exposed quartz is etched to 180° phase depth (block 606). The quartz etch may be done with either a hard-mask etch (no resist) or with the first level resist patterning still present. If the hard-mask etch path is chosen, the risk of quartz bump defects risk may be minimized by multiple clean/etch cycles. After etching the mask to 180° phase depth, a second mask patterning step is performed (block 608), as shown in FIG. 7B. The exposed chrome is removed during an etch process (block 610), and the area under this removed chrome becomes the zero aperture features as shown in FIG. 5A.

Figure 8A:
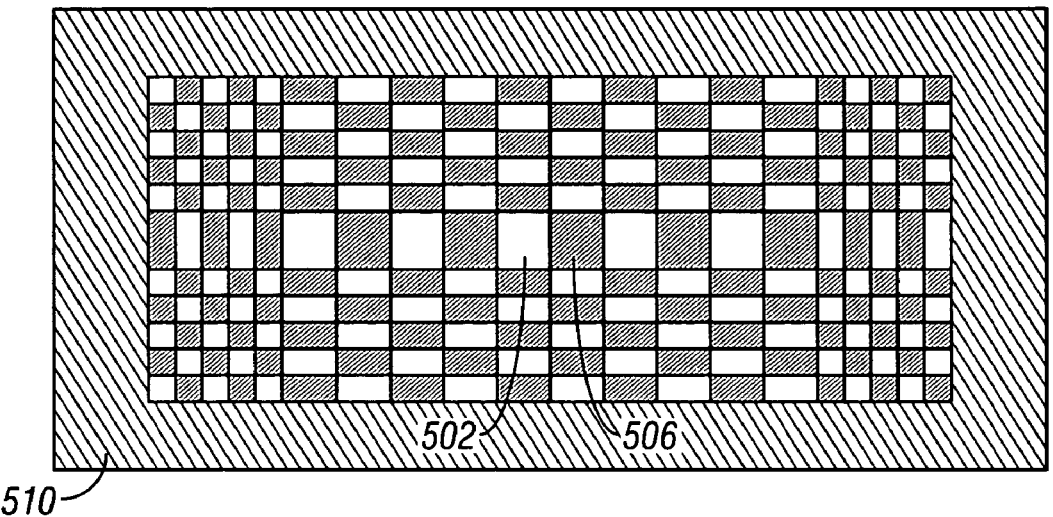
FIG. 8A shows an upper limit of a maximum CD (critical dimension)/overlay.
Figure 8B:
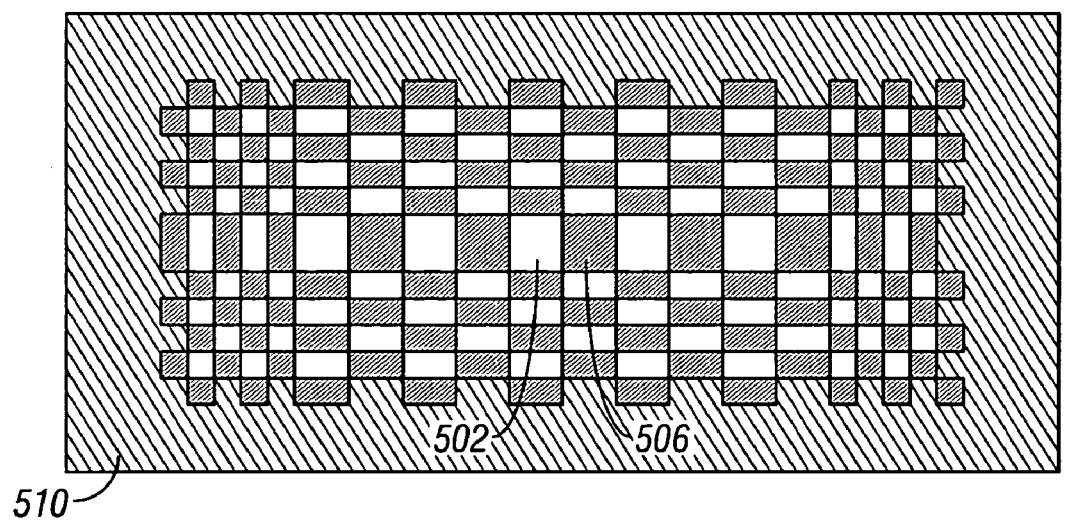
FIG. 8B shows a lower limit of a maximum CD/overlay.

The requirements for the second mask lithographic step may be relatively loose, e.g., similar to the requirements of the mask fabrication process described in FIGS. 4A–4C. The relaxed constraints of the second mask patterning step may be facilitated by the phase grating surrounding the printable contacts. FIG. 5A shows the target for the phase edge, e.g., the middle 520 of the outer row of the phase grating. FIG. 8A shows the upper limit of the maximum CD (critical dimension)/overlay, while FIG. 8B shows the lower limit of CD/overlay. If more chrome is removed than shown in FIG. 8A, then quartz which doesn't have a phase grating may be exposed and could cause printing defects if the exposed area is too large. If less chrome is removed than shown in FIG. 8B, then the pi apertures may not be counterbalanced by the zero apertures and could cause printing defects if the exposed area is too large.

In an embodiment, the second mask patterning step may be optional. If the entire mask utilizes a phase grating then the chrome may be removed from the entire mask, forming a completely chromeless mask.

FIG. 9A shows a simulated aerial view of contacts 902 imaged with a chromeless APSM structure with a phase grating field 904 (FIG. 9B) in an imaging system with 193 nm wavelength illumination, 0.92 NA and 0.4 Sigma. FIG. 10 shows that the chromeless APSM structure provides good contrast.

Although chromeless APSMs with phase grating fields including five SRAF structures have been described, other numbers of SRAF structure may be used, e.g., two, three, four, or six.

A number of embodiments have been described. Nevertheless, it will be understood that various modifications may be made without departing from the spirit and scope of the invention. For example, blocks in the flowcharts may be skipped or performed out of order and still produce desirable results. Accordingly, other embodiments are within the scope of the following claims.

The invention claimed is:

1. An apparatus comprising:
    a plurality of features, the features including
        a plurality of primary features having different phase step heights in a primary feature region, each primary feature abutting at least one other primary feature with a different phase step height, and
        a plurality of sub resolution features in a boundary region surrounding the primary feature region,
    wherein each of the primary features is dimensioned to resolve at an imaging plane at a resolution, and
    wherein each of the sub resolution features is dimensioned not to resolve at the imaging plane at said resolution.

2. The apparatus of claim 1, wherein there is no opaque material between adjacent features in the primary feature region and in the boundary region.

3. The apparatus of claim 1, wherein said primary features abut said sub resolution features.

4. The apparatus of claim 1, wherein the primary feature region comprises a chromeless alternating phase shift mask (APSM) structure.

5. The apparatus of claim 1, wherein the boundary region comprises an outer row including sub resolution features furthest from the primary feature region.

6. The apparatus of claim 5, wherein the sub resolution features have dimensional tolerances corresponding to a first lithography step precision, and
    wherein the outer row has a dimension corresponding to a second lithography step precision.

7. The apparatus of claim 6, wherein said dimension of the outer row comprises a width of the sub resolution features of the outer row.

8. The apparatus of claim 6, wherein the dimensional tolerances corresponding to the first lithography step precision are smaller than dimensional tolerances corresponding to the second lithography step precision.

9. The apparatus of claim 1, wherein the primary features comprise contact features.

10. A method comprising:
    exposing a pattern of features in a layer of photoresist material on a mask substrate, said pattern of features including
        a plurality of exposed primary features in a primary feature region, a plurality of unexposed primary features in the primary feature region, wherein each exposed primary feature abuts at least one other unexposed primary feature, a plurality of exposed sub resolution features in a boundary region surrounding the primary feature region, and a plurality of unexposed sub resolution features in the boundary region;

developing the photoresist such that the mask substrate is uncovered in accordance with the pattern of features;

etching the exposed mask substrate to define corresponding primary features and sub resolution features to have a phase step height in the mask substrate; and removing the remaining photoresist material, wherein no opaque material is found between the primary features and the sub resolution features on the mask substrate.

11. The method of claim 10, wherein said exposing comprises exposing the pattern of features in the layer of photoresist material on the mask substrate using a first lithography tool.

12. The method of claim 11, wherein the first lithography tool comprises an electron beam lithography tool.

13. The method of claim 11, further comprising:

coating the mask substrate with another layer of photoresist material; and defining a boundary around the boundary region using a second photolithography tool, the second lithography tool having a lower precision than the first lithography tool.

14. The method of claim 13, wherein the precision of the second lithography tool corresponds to a dimension of sub resolution features in an outer row of the boundary region.

15. The method of claim 13, wherein the second lithography tool comprises a laser writer lithography tool.

16. The method of claim 10, further comprising exposing a substrate using the mask substrate.

17. An alternating phase shift mask (APSM) comprising:

a chromeless APSM structure including a plurality of features, the features including a plurality of zero and pi primary features in a primary feature region, wherein each zero primary feature abuts at least one pi primary feature, and a plurality of sub resolution features in a boundary region surrounding the primary feature region, wherein each of the primary features is dimensioned to resolve at an imaging plane at a resolution, and wherein each of the sub resolution features is dimensioned not to resolve at the imaging plane at said resolution.

18. The mask of claim 17, wherein there is no chrome between adjacent features in the primary feature region and in the boundary region.

19. The mask of claim 17, wherein said primary features abut said sub resolution features.

20. The mask of claim 17, wherein the boundary region comprises an outer row including sub resolution features furthest from the primary feature region.

21. The mask of claim 20, wherein the sub resolution features have dimensional tolerances corresponding to a first lithography step precision, and wherein the outer row has a dimension corresponding to a second lithography step precision.

22. The mask of claim 21, wherein said dimension of the outer row comprises a width of the sub resolution features of the outer row.

23. The mask of claim 21, wherein the dimensional tolerances corresponding to the first lithography step precision are smaller than dimensional tolerances corresponding to the second lithography step precision.

24. The mask of claim 17, wherein the zero and pi primary features comprise contact features.

25. An apparatus comprising:

an alternating phase shift mask (APSM) comprising a chromeless primary feature region and an assist feature region surrounding the primary feature region, wherein:

the primary feature region includes a first primary feature dimensioned to resolve at an imaging plane and having a first phase step height, and a second primary feature dimensioned to resolve at the imaging plane, the second primary feature sharing a common edge with the first primary feature and having a second phase step height such that electromagnetic radiation from the first primary feature destructively interferes with electromagnetic radiation from the second primary feature at the imaging plane; and the assist feature region includes a first assist feature dimensioned not to resolve at the imaging plane, the first assist feature having the first phase step height and sharing a common edge with the second primary feature, and a second assist feature dimensioned not to resolve at the imaging plane, the second assist feature having the second phase step height and sharing a common edge with the first primary feature.

26. The apparatus of claim 25, wherein:

the first primary feature comprises a pi primary feature;

the second primary feature comprises a zero primary feature;

the first assist feature comprises a pi assist feature; and the second assist feature comprises a zero assist feature.

* * * * *